(12) United States Patent
Pupalaikis

(10) Patent No.: US 7,450,043 B2
(45) Date of Patent: Nov. 11, 2008

(54) METHOD OF COMPENSATING FOR DETERMINISTIC JITTER DUE TO INTERLEAVE ERROR

(75) Inventor: Peter J. Pupalaikis, Ramsey, NJ (US)

(73) Assignee: LeCroy Corporation, Chestnut Ridge, NY (US)

( * ) Notice: Subject to any disclaimer, the term of this patent is extended or adjusted under 35 U.S.C. 154(b) by 10 days.

(21) Appl. No.: 11/590,342

(22) Filed: Oct. 31, 2006

(65) Prior Publication Data

US 2008/0100483 A1   May 1, 2008

(51) Int. Cl.
*H03M 1/10* (2006.01)
(52) U.S. Cl. .................................. 341/118; 341/155
(58) Field of Classification Search .............. 341/118, 341/120, 155; 702/189–196
See application file for complete search history.

(56) References Cited

U.S. PATENT DOCUMENTS

| | | | |
|---|---|---|---|
| 4,763,105 | A | 8/1988 | Jenq |
| 4,962,380 | A | 10/1990 | Meadows |
| 5,239,299 | A | 8/1993 | Apple et al. |
| 6,269,317 | B1 | 7/2001 | Schachner et al. |
| 6,567,030 | B1 | 5/2003 | Pupalaikis |
| 6,819,279 | B2 | 11/2004 | Pupalaikis |
| 7,084,793 | B2 * | 8/2006 | Elbornsson .................. 341/118 |
| 2006/0195301 | A1 | 8/2006 | Mueller et al. |
| 2007/0244669 | A1 * | 10/2007 | Vogel et al. .................. 702/190 |

FOREIGN PATENT DOCUMENTS

JP   2004328436 A   * 11/2004

OTHER PUBLICATIONS

Vogel, The Impact of Combined Channel Mismatch Effects in Time-Interleaved ADCs, IEEE Transactions on Instrumentation and Measurement, vol. 54, No. 1, Feb. 2005, pp. 415-427.*
Jin et al., A Digital Technique for Reducing Clock Jitter Effects in Time-Interleaved A/D Converter, Proceedings of the 1999 IEEE International Symposium on Circuits and Systems, ISCAS '99. IEEE, May 30-Jun. 2, 1999. vol. 2, pp. 330-333.*

* cited by examiner

*Primary Examiner*—Howard Williams
(74) *Attorney, Agent, or Firm*—Gordon Kessler

(57) ABSTRACT

A system and method for compensation of deterministic jitter in measurements made when utilizing a plurality of time interleaved analog-to-digital converters (ADCs). The system includes edge timing measurement error information for each of the plurality of time interleaved ADCs and a processing element for converting a measured edge time of one or more edges of a waveform into a corrected edge time. The processing element determines the corrected edge time by subtracting the edge timing measurement error corresponding to one or more of the time interleaved ADCs.

18 Claims, 5 Drawing Sheets

Edge Time Corrector in Implementation Phase

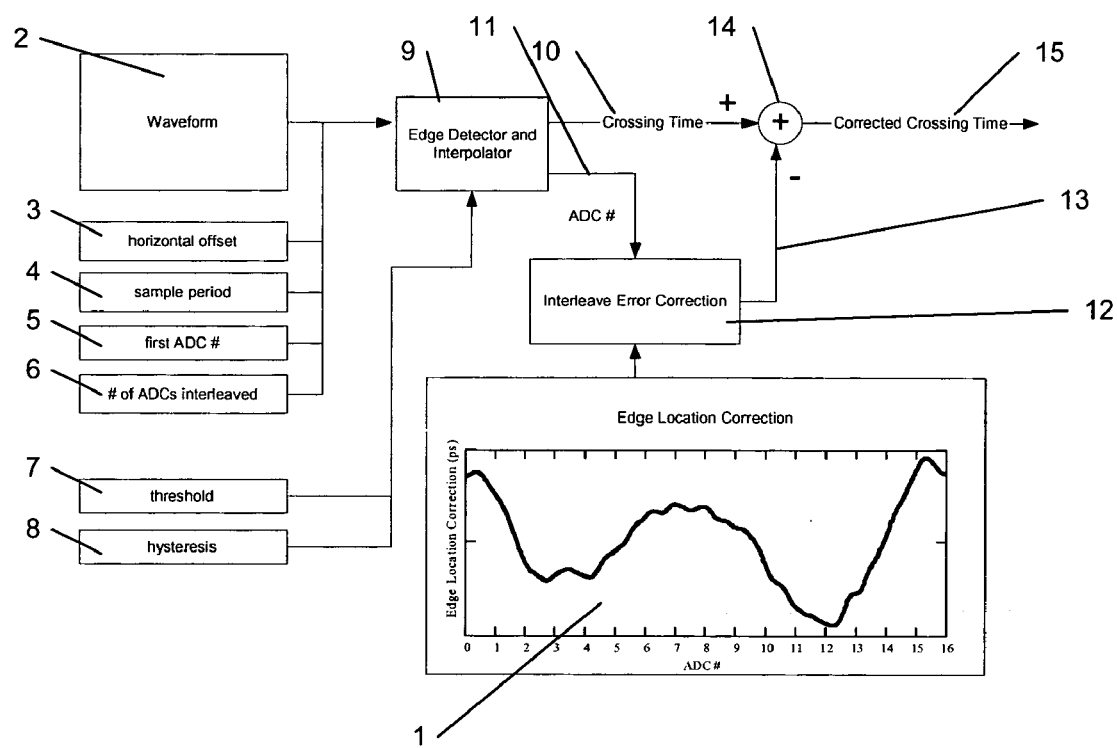
Figure 1 – Edge Time Corrector in Implementation Phase

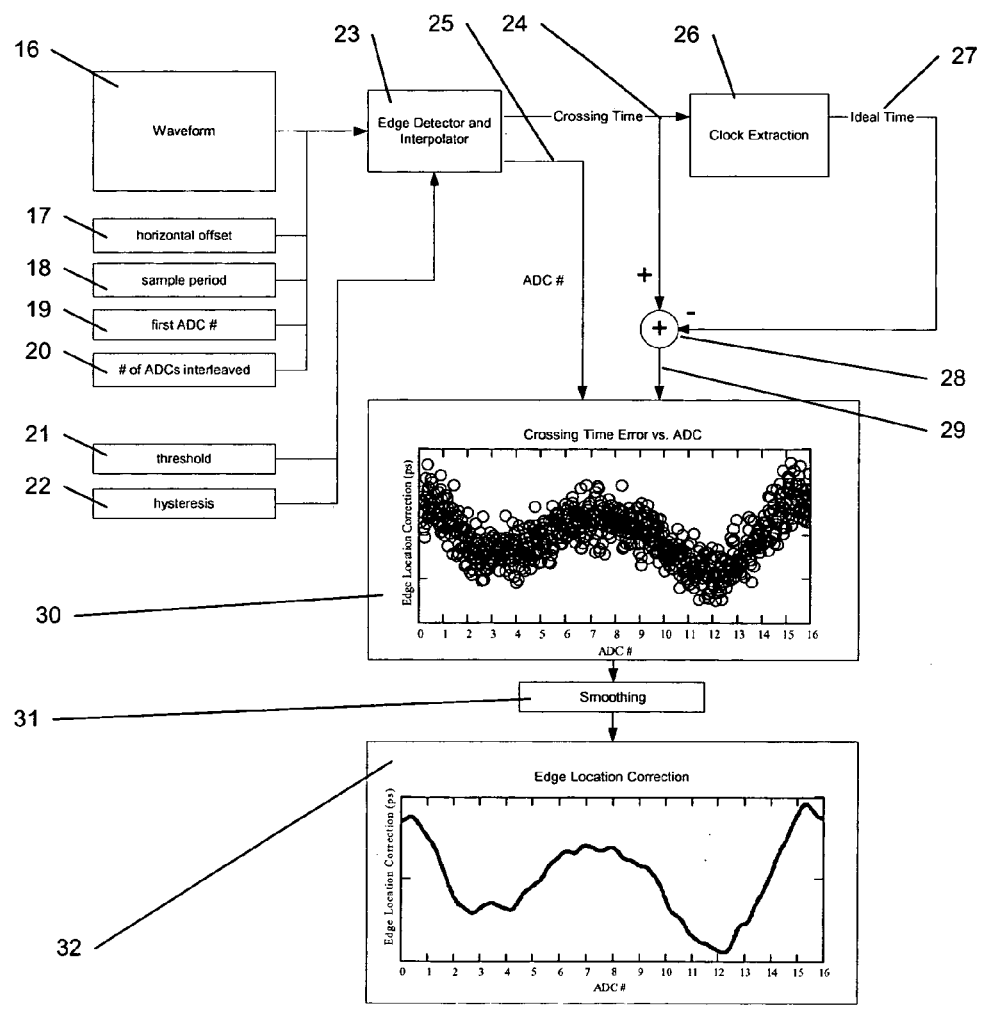
Figure 2 – Edge Time Corrector in Calibration Phase

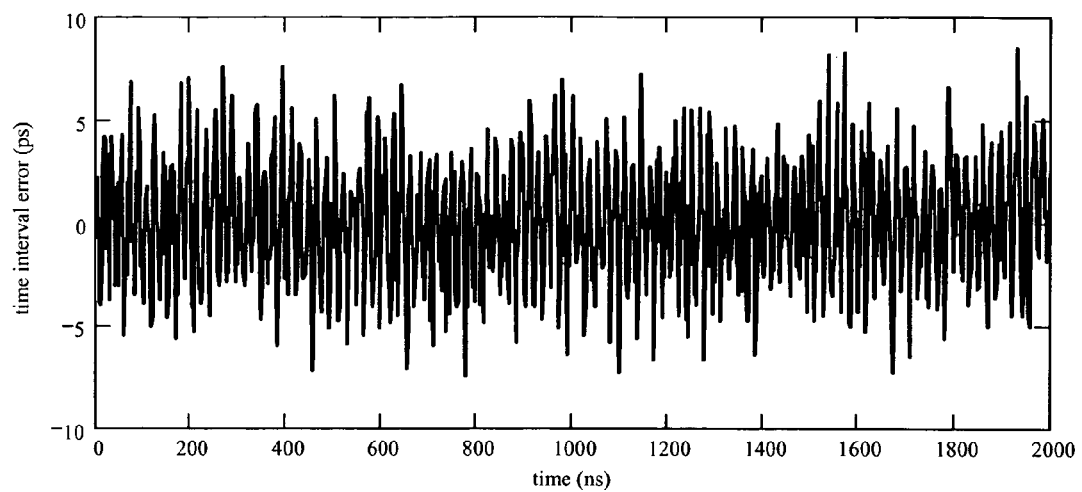
Figure 3 – Track of Time Interval Error
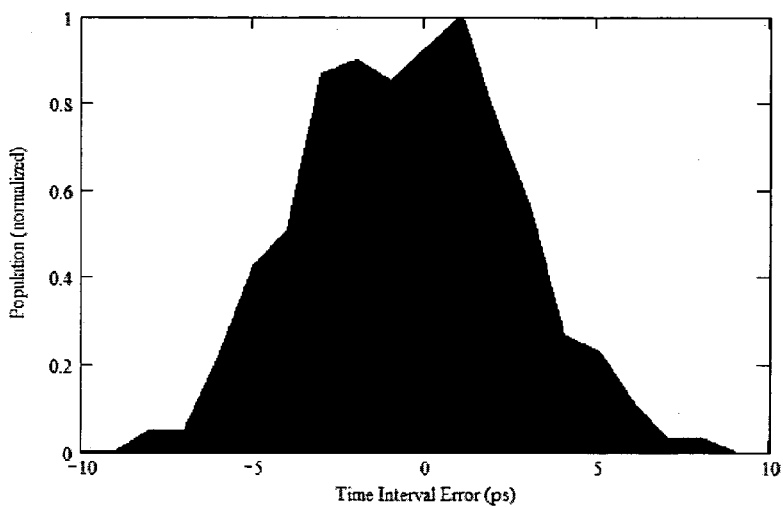
Figure 4 – Histogram of Time Interval Error

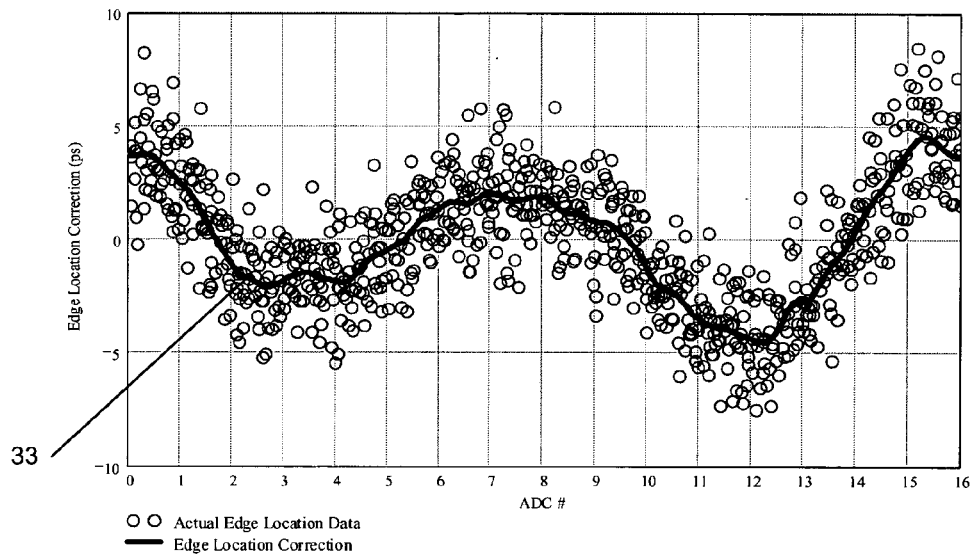
Figure 5 – Timing Error versus ADC Sampling Phase
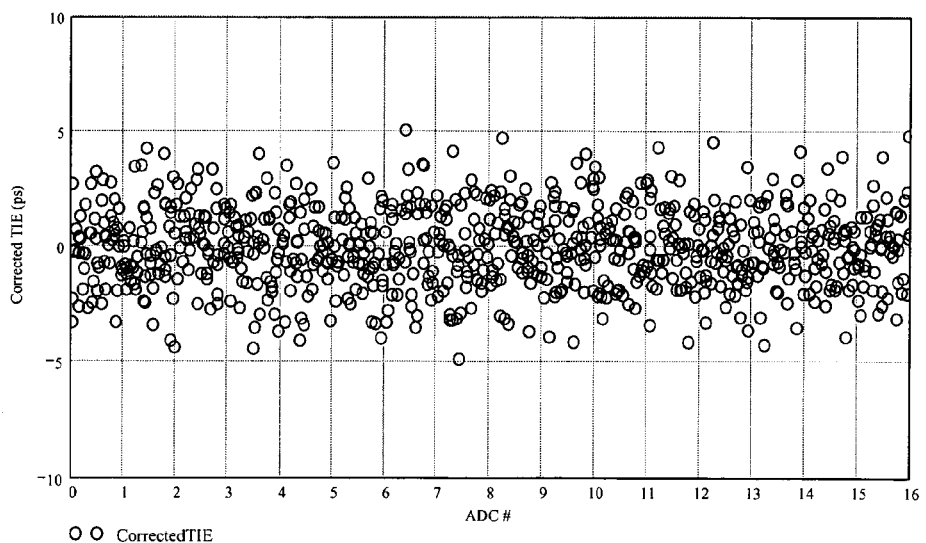
Figure 6 – Corrected TIE versus ADC Sampling Phase

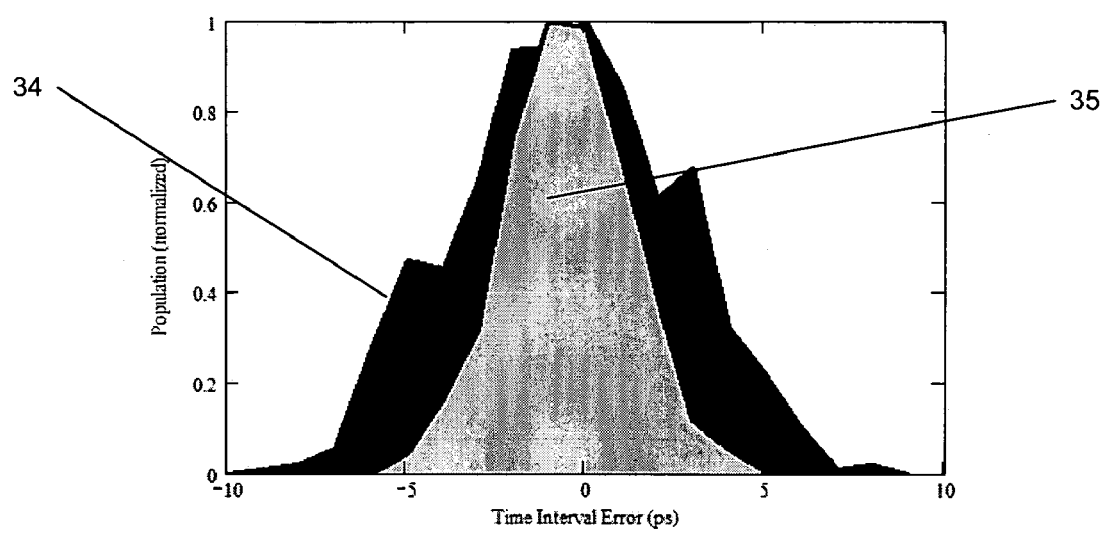
Figure 7 – Comparison of Histogram of Uncorrected and Corrected TIE

METHOD OF COMPENSATING FOR DETERMINISTIC JITTER DUE TO INTERLEAVE ERROR

FIELD OF THE INVENTION

The present invention relates generally to real-time digital oscilloscopes (DSOs), and more specifically the invention relates to real-time digital oscilloscopes utilizing time interleaved analog-to-digital converters (ADCs) to digitize waveforms. Furthermore, the invention relates to the utilization of DSOs for the purpose of making accurate jitter measurements.

BACKGROUND OF THE INVENTION

In the development of serial data communication channels, it is necessary for compliance testing to measure a bit-error-rate (BER) and further to determine any sources of degradation of BER in the channel. One of the most important sources of BER degradation is jitter. Therefore it is important to understand the jitter contribution to the BER degradation.

Many different measurement solutions exist for measuring jitter and BER. These consist of a bit error rate tester (BERT), a time interval analyzer (TIA) and the digital oscilloscope (DSO). The DSO solutions include both the equivalent time or so-called sampling oscilloscope and the real-time oscilloscope.

The real-time oscilloscope is rapidly becoming the instrument of choice for jitter testing. Such a real-time scope measures jitter in many ways. The basic idea is to capture a long record of a serial data signal, extract a clock waveform using a digital phase-locked-loop (PLL) and measure the difference between the clock edge and the data edge at the boundaries of a unit interval (UI). The measurement of this difference for each data bit is called the time interval error (TIE). The measurement and analysis of multiple values of TIE for a waveform leads to a characterization of jitter. This measured jitter may further comprise many components, including both random and deterministic jitter, bounded and unbounded jitter, periodic jitter, intersymbol interference (ISI) induced jitter etc. Of particular concern is the random unbounded jitter, typically assumed and measured to be Gaussian in nature. This is because of the industry-accepted standard relationship of total jitter to the random and deterministic jitter:

$$Tj=Dj+14 \cdot Rj$$

In this equation, Dj is the peak-peak deterministic (bounded) jitter and Rj is the standard deviation of the assumed Gaussian distributed (unbounded) random jitter. The factor of 14 is used to determine the peak-peak jitter. The equation is valid for a BER of 1 error per $10^{12}$ transmitted bits. The Tj is the maximum eye closure due to jitter for this number of bits and it must not exceed the unit interval.

In measurement instruments, the classification of jitter, especially between deterministic and random jitter is very important because any inadvertent classification of jitter as random or deterministic involves the above-noted factor of 14. Furthermore, random jitter is most often a function of clock generation, so for clock component manufacturers manufacturing clocks with very low Rj, it is important that any measurement instrument can measure very low values of Rj accurately.

Regarding the real-time oscilloscope as a jitter measurement instrument, one figure of merit is the jitter noise floor. The jitter noise floor is defined as the lowest value of Rj that the scope will measure when an input signal is applied with zero Rj. Typically, the Rj value calculated will be the quadrature addition of the jitter noise floor of the oscilloscope and the actual Rj present in the device under test.

It is important that the jitter noise floor of the measurement instrument be as low as possible.

Sources of error that lead to increased jitter noise floor in the oscilloscope are vertical noise, phase noise and timebase stability of the internal oscilloscope clock, and timing errors of analog-to-digital converters (ADCs) used to digitize the waveform. When time interleaved ADCs are utilized to digitize the waveform, the timing errors are due to an effect called interleave error.

Many efforts have been made to minimize all of these effects and therefore to lower their effect on jitter measurements. With regard to interleave error, the prior art has typically dealt with this by designs that calibrate the ADC timing in the scope (see Meadows, U.S. Pat. No. 4,962,380, Jeng, U.S. Pat. No. 4,763,105 and Schachner et al., U.S. Pat. No. 6,269,317). These methods address only the measurement and adjustment of hardware means for adjusting timing relationships that do not vary with frequency and is a good first order calibration. Unfortunately, interleave error usually, to some extent, varies with frequency. Other methods have been utilized to correct for the error utilizing digital signal processing methods (see Apple et al. U.S. Pat. No. 5,239,299, Pupalaikis U.S. Pat. No. 6,567,030, and Pupalaikis U.S. Pat. No. 6,819,279). These methods, although precise, will still have some residual error. Other methods attempt to reduce the symptoms of ADC interleave error (such as Mueller et al., U.S. patent application Ser. No. 11/280,493), but these methods are not exact.

All of the prior art utilized to correct for interleave error result in improvements of the effect on the jitter noise floor due to interleave error, but a method is needed that directly compensates for increased jitter noise floor due to the effect of interleave error, or possibly the residual interleave error when any of this prior art is utilized.

OBJECTS OF THE INVENTION

It is an object of this invention to provide a method and apparatus that overcomes the limitations of the prior art, including but not limited to directly reducing or eliminating the contribution of interleave error in jitter measurements utilizing interleaved digitizers.

Still other objects and advantages of the invention will in part be obvious and will in part be apparent from the specification and the drawings.

SUMMARY OF THE INVENTION

FIG. 3 shows a track of the time interval errors of many edges of a clock waveform in an exemplary embodiment. Such a track shows the measurement of the error versus the time in the waveform. The time interval error was measured by taking the difference between the edge times of an ideal clock waveform and the waveform acquired. The histogram of the time interval error is shown in FIG. 4. The standard deviation is 2.945 ps. In this situation, the distribution is essentially Gaussian and the random jitter reported in this measurement is 2.945 ps. This serves to exemplify the situation.

In this exemplary situation, the oscilloscope utilized to capture this waveform samples at 16 GS/s (Giga Samples per Second) and utilizes 16 separate 1 GS/s digitizers that independently sample the waveform and whose resulting acquisition is time interleaved to form the aggregate 16 GS/s acquisition. Various methods and algorithms have been utilized to interpolate and measure the threshold crossing times of the waveform. This invention is not primarily concerned with these algorithms. Indeed despite the application of means to ensure good ADC timing (reduce or eliminate the interleave error), some residual error remains. Thus this invention is not primarily concerned with the actual timing error of the interleaved digitizers as other method tend to address, but instead focus on the effect of any timing error on measurement of the random jitter.

In almost any realistic situation, the measured location of a waveform edge with regard to which interleaved digitizers have sampled points near the edge is unconnected. In other words, we should not find any correlation between the timing error measured and the digitizer(s) that sampled the points making up the edge whose time is being measured.

A relationship is generated with a plot of this relationship as shown in FIG. 5. This plot was generated by plotting the time interval error measurement versus the ADC (of the 16 ADCs noted above) that sampled the point on the edge. Where edges invariably fall between actually sampled points (i.e. were interpolated), a fractional ADC number is applied (i.e. the edge occurred between two ADCs). FIG. 5 shows that there is in fact a strong correlation between the ADC sampling phase and the timing error. It is important to understand that, in general, this can only be produced by errors in the oscilloscope. Furthermore, the correlation indicates that the error is a deterministic error in the oscilloscope, but that this error will generally produce TIE measurement errors that will be interpreted as random errors. This correlation is illuminated by applying a median smoothing filter to the data, resulting in a smooth edge location correction curve [33]. This curve is measured at the time of the measurement, or in a calibration phase and serves as a time correction to each edge time measured.

When the edge location correction curve [33] is subtracted from each measurement of TIE and the standard deviation is again taken, we obtain a value of 2.417 ps. This value is called the ADC mismatch component of the random jitter measured. When the ADC mismatch component is subtracted in quadrature from the standard deviation of the TIE measured, a value of 1.683 ps is obtained, implying that 1.683 is a better estimate of the random jitter in the applied signal. In this situation in accordance with the invention, it is expected that over one picosecond of random jitter can be reduced from the Rj measurement yielding over 14 ps more margin in the Tj measurement that was excessively high only due to the added ADC mismatch component.

Thus in accordance with the invention the edge location correction curve [33] is utilized as a timing correction in this and successive waveform acquisitions. For each time interval error calculated, the ADC(s) that sampled the edge is determined and the correction is supplied by the lookup table and subtracted from the time interval error calculated.

On a subsequent acquisition, the edge location correction curve [33] is applied. FIG. 6 shows a lack of correlation of the corrected TIE to the ADC sampling phase after application of the present invention.

A comparison of the uncorrected TIE [34] and the corrected TIE [35] is shown in FIG. 7. In this measurement, the standard deviation of the uncorrected TIE is 2.958 ps and the standard deviation of the corrected TIE is 1.178 ps.

BRIEF DESCRIPTION OF DRAWINGS

For a more complete understanding of the invention, reference is made to the following description and accompanying drawings, in which:

FIG. 1 illustrates the method of interleave error correction in an implementation phase;

FIG. 2 illustrates the method of interleave error correction in a calibration phase;

FIG. 3 is a track of time interval error;

FIG. 4 is a histogram of timer interval error measurements;

FIG. 5 is a table showing time interval error versus ADC sampling phase;

FIG. 6 is a table showing corrected time interval error versus ADC sampling phase;

FIG. 7 is two histograms comparing the uncorrected and corrected time interval error;

DETAILED DESCRIPTION OF THE PREFERRED EMBODIMENTS

FIG. 1 shows an edge time corrector for interleave error in an implementation phase constructed in accordance with the invention. In this phase, there exists a lookup table [1] whose generation will be described subsequently. During waveform processing, a waveform [2] is acquired and processed. A waveform [2] consists of an array of voltages. Generally, the time corresponding to these voltages is calculated through additional waveform descriptor information which includes a horizontal offset [3] and a sample period [4] such that the time of a point k in the waveform is given by:

time[$k$]=$k$·sample_period+horizontal_offset

Because the processing system has intimate knowledge of how the waveform was acquired, the waveform descriptor also has information such as first ADC [5] and the number of ADCs interleaved [6] that enables the calculation of the ADC that sampled a given point:

ADC[$k$]=mod($k$+first_ADC,ADCS_Interleaved)

The waveform [2] is presented to an edge detector and interpolator [9] that calculates crossing times (i.e. when consecutive voltage measurements in the waveform cross a predetermined threshold value) in the waveform. Generally, the edge detector and interpolator [9] calculates crossing times [10] in the waveform [2] utilizing predetermined algorithms and additional supplied information such as the threshold [7] and optionally a hysteresis value [8]. Furthermore, in accordance with this embodiment of the invention, the ADC number is calculated that corresponds to a given crossing time by first calculating the waveform index of the crossing time:

$$k = \frac{\text{crossing\_time} - \text{horizontal\_offset}}{\text{sample\_period}}$$

and then calculating the ADC number based on the waveform index:

ADC[$k$]=mod($k$+first_ADC,ADCS_Interleaved)

Note that in this calculation, the waveform index and the ADC number, typically thought of as integers, may contain a fractional portion.

The ADC number calculated [11] is supplied to the interleave error corrector [12] which looks up a value in the lookup table [1] and utilizes this value as a correction [13]. The lookup table might implement an interpolation method to determine the value from the table, or the table might be fit to an arbitrary function. Interpolation is a well known method to those skilled in the art. The negative of the correction [13] is added to the crossing time [10] at the adder [14] producing a corrected crossing time [15]. These corrected crossing times [15] have the benefit of removing the interleave error effect from the edge time calculation.

Now, the preferred method of calculating the lookup table [1] in FIG. 1 will be explained.

FIG. 2 shows an interleave error corrector constructed in accordance with an embodiment of the invention in the calibration phase. In a calibration phase, a waveform [16] with the same definition as waveform [2] with it's accompanying descriptor information such as horizontal offset [17], sampling period [18], first ADC [19] and number of interleaved ADCs [20] as discussed previously is provided to an edge detector and interpolator [23] with the accompanying threshold [21] and optional hysteresis [22]. The edge detector and interpolator [23] is identical to [9]. Crossing times [24] and ADC number [25] are calculated as discussed previously. The crossing time is supplied to a clock extractor [26] that generally uses a PLL mechanism to generate ideal crossing times [27]. The crossing time [24] is added to the negative of the ideal crossing time [27] at adder [28] to generate a time interval error value [29]. The ADC number [25] calculated along with the TIE value [29] form a coordinate in the crossing time versus ADC scatter relationship [30]. The scatter relationship is smoothed, preferably utilizing a median smoothing filter algorithm to generate the edge time correction lookup table [32] to be utilized as the lookup table [1] in the implementation phase as shown in FIG. 1. A function might also be defined and used in place of lookup table [1]. Median smoothing is well known to those skilled in the art. It is important to remember that scatter relationship should be considered cyclic when smoothing. In other words, the right edge of the scatter plot representing the scatter relationship should be considered to be immediately to the left of the left edge of the scatter plot and vice versa.

Note that for the sake of clarity, both an implementation and calibration phase are shown in two separate figures as two distinct phases, but they may coexist. In other words, it shall be understood that for a given waveform acquisition, a calibration measurement may be performed that generates the lookup table [32] and directly uses it in an implementation phase as shown in FIG. 1 on the same waveform. Furthermore, if lookup table [32] is already in existence, the calibration phase might involve the refinement of the values as opposed to a complete recalculation. Furthermore, the refined values could be utilized on past calculations of crossing times [10] to improve results calculated on past waveform acquisitions.

Note that for the sake of clarity, the word scatter relationship has been used to represent a relationship between variables that is generally plotted to form a scatter plot. A scatter relationship is the data relationship without the implication that it must be plotted in order to analyze and make use of the relationship.

It has been shown that the application of FIG. 2 as a calibration that generates the lookup table [32] which is utilized as the lookup table [1] in an implementation phase as in FIG. 1 directly reduces or eliminates the contribution of interleave error in jitter measurements utilizing interleaved digitizers.

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall there between.

What is claimed is:

1. A system for compensation of deterministic jitter in measurements made when utilizing a plurality of time interleaved analog-to-digital converters (ADCs) comprising:
    edge timing measurement error information for each of the plurality of time interleaved ADCs, the edge timing error information being defined, in a calibration phase, as a relationship for compensation of deterministic jitter in measurements made when utilizing a plurality of time interleaved analog-to-digital converters (ADCs), by:
        detecting a multitude of edges of a waveform;
        determining measured edge times corresponding to the multitude of edges;
        determining edge timing measurement errors based upon the comparison of ideal edge times and the measured edge times by associating a value of each measured edge time in relation to the associated one or more time interleaved ADCs to form a scatter relationship, and determining deterministic errors in accordance with the scatter relationship; and
        associating each edge timing measurement error with one or more of the time interleaved ADCs; and
    a processing element for converting a measured edge time of one or more edges of a waveform into a corrected edge time;
    wherein the processing element determines the corrected edge time by subtracting the edge timing measurement error corresponding to one or more of the time interleaved ADCs.

2. The system of claim 1, wherein the subtracted edge timing measurement error is determined in accordance with edge timing measurement error information corresponding to two ADCs that consecutively sampled the waveform.

3. The system of claim 2, wherein a sample time of each of the two ADCs straddle the measured edge time.

4. The system of claim 1, wherein the subtracted edge timing measurement error is determined in accordance with the edge timing measurement error information corresponding to a single ADC.

5. The system of claim 4, wherein a sample time of the single ADC is within a predetermined time of the measured edge time.

6. The system of claim 1, wherein the measured edge time is determined by an arbitrary edge detection and interpolation algorithm.

7. The system of claim 6, wherein the measured edge time is utilized to determine which one or more of the plurality of ADCs sampled the one or more edges of the waveform.

8. A method for compensation of deterministic jitter in measurements made when utilizing a plurality of time interleaved analog-to-digital converters (ADCs), comprising the steps of:
    defining edge timing measurement error information for each of the plurality of time interleaved ADCs, the edge timing error information being defined, in a calibration phase, as a relationship for compensation of deterministic jitter in measurements made when utilizing a plurality of time interleaved analog-to-digital converters (ADCs), by:

detecting a multitude of edges of a waveform;

determining measured edge times corresponding to the multitude of edges;

determining edge timing measurement errors based upon the comparison of ideal edge times and the measured edge times by associating a value of each measured edge time in relation to the associated one or more time interleaved ADCs to form a scatter relationship, and determining deterministic errors in accordance with the scatter relationship; and associating each edge timing measurement error with one or more of the time interleaved ADCs; and converting a measured edge time of one or more edges of a waveform into a corrected edge time;

wherein the corrected edge time is determined by subtracting the edge timing measurement error corresponding to one or more of the time interleaved ADCs.

9. The method of claim 8, wherein the subtracted edge timing measurement error is determined in accordance with edge timing measurement error information corresponding to two ADCs that consecutively sampled the waveform.

10. The method of claim 9, wherein a sample time of each of the two ADCs straddle the measured edge time.

11. The method of claim 8, wherein the subtracted edge timing measurement error is determined in accordance with the edge timing measurement error information corresponding to a single ADC.

12. The method of claim 11, wherein a sample time of the single ADC is within a predetermined time of the measured edge time.

13. The method of claim 8, wherein the measured edge time is determined by an arbitrary edge detection and interpolation algorithm.

14. The method of claim 13, wherein the measured edge time is utilized to determine which one or more of the plurality of ADCs sampled the one or more edges of the waveform.

15. A method for defining, in a calibration phase, a relationship represented by a function determined through regression, for compensation of deterministic jitter in measurements made when utilizing a plurality of time interleaved analog-to-digital converters (ADCs), comprising the steps of:

detecting a multitude of edges of a waveform;

determining measured edge times corresponding to the multitude of edges;

determining edge timing measurement errors based upon the comparison of ideal edge times and the measured edge times; and associating each edge timing measurement error with one or more of the time interleaved ADCs.

16. The method of claim 15, wherein the defined relationship is represented by a look up table.

17. The method of claim 16, wherein the look up table is generated by smoothing data of the associated edge timing measurements and the one or more associated ADCs.

18. A method for defining, in a calibration phase, a relationship for compensation of deterministic jitter in measurements made when utilizing a plurality of time interleaved analog-to-digital converters (ADCs), comprising the steps of:

detecting a multitude of edges of a waveform;

determining measured edge times corresponding to the multitude of edges;

determining edge timing measurement errors based upon the comparison of ideal edge times and the measured edge times by associating a value of each measured edge time in relation to the associated one or more time interleaved ADCs to form a scatter relationship, and determining deterministic errors in accordance with the scatter relationship; and associating each edge timing measurement error with one or more of the time interleaved ADCs.

* * * * *